United States Patent
Rankin, Sr.

(10) Patent No.: US 6,716,483 B1
(45) Date of Patent: Apr. 6, 2004

(54) METHODS FOR CUTTING ARTICLES CONTAINING AT LEAST A SUBSTANTIAL AMOUNT OF WOOD

(75) Inventor: David Daniel Rankin, Sr., Troutman, NC (US)

(73) Assignee: Moulder Services, Inc., Troutman, NC (US)

( * ) Notice: Subject to any disclaimer, the term of this patent is extended or adjusted under 35 U.S.C. 154(b) by 0 days.

(21) Appl. No.: 09/892,095

(22) Filed: Jun. 26, 2001

(51) Int. Cl.$^7$ .............................................. C23C 16/30
(52) U.S. Cl. .................... 427/249.18; 427/255.394; 427/294; 407/119; 408/1 R
(58) Field of Search .................... 427/249.18, 255.394, 427/294, 249.17, 255.34, 255.36; 407/119; 408/1 R, 1

(56) References Cited

U.S. PATENT DOCUMENTS

| | | | |
|---|---|---|---|
| 3,755,866 A | * 9/1973 | Ohlsson | 407/119 |
| 4,869,302 A | 9/1989 | Robson | |
| 4,992,153 A | 2/1991 | Bergmann et al. | |
| 5,024,563 A | * 6/1991 | Randall | 408/1 R |
| 5,272,014 A | * 12/1993 | Leyendecker et al. | 428/457 |
| 5,630,275 A | * 5/1997 | Wexler | 30/50 |
| 5,707,748 A | 1/1998 | Bergmann et al. | |
| 5,782,836 A | * 7/1998 | Umber et al. | 606/79 |
| 5,957,755 A | * 9/1999 | LaFlamme | 451/48 |
| 6,032,372 A | * 3/2000 | Dischler | 30/346.57 |
| 6,575,671 B1 | * 6/2003 | North et al. | 407/119 |

OTHER PUBLICATIONS

*Preparing Tools for PVD Coating*, F. Teeter et al., Cutting Tool Engineering, vol. 46, No. 1, Feb. 1994 (2 pages).
*Cryogenic Processing Briefing*, Controlled Thermal Processing, Inc., Poplar Grove, Illinois, pp. 1–26 (undated), no date available.
Material Safety Data Sheet for *Hardlube*, Balzers Tool Coating, Amherst, NY, Jun. 1997 (2 pages).
Material Safety Data Sheet for *Ferrous or Nonferrous Alloy*, Teledyne Pittsburgh Tool Steel, Monaca, PA, Nov. 1985 (3 pages).
*Balinit®Hardlube–Get a Grip on Machining Reliability*, Balzers Tool Coatting Inc., North Tonawanda, NY (undated, 4 pages), no date available.

* cited by examiner

Primary Examiner—Bret Chen
(74) Attorney, Agent, or Firm—Alston & Bird LLP

(57) ABSTRACT

A conventional cutting tool is provided and a cutting edge of that tool is formed and/or sharpened. A relatively hard layer is applied over at least a portion of the cutting tool that includes the cutting edge and then a friction-reducing layer is applied over the hard layer. The entire coated cutting tool, or at least a portion of the coated cutting tool that includes the cutting edge, is cryogenically treated. The coated and cryogenically treated cutting tool is mounted in a conventional manner to a conventional cutting machine, and then used cut articles containing at least a substantial amount of wood.

20 Claims, 2 Drawing Sheets

METHODS FOR CUTTING ARTICLES CONTAINING AT LEAST A SUBSTANTIAL AMOUNT OF WOOD

FIELD OF THE INVENTION

The present invention pertains to the woodworking industry and, more particularly, to coated cutting tools for cutting articles containing at least a substantial amount of wood.

BACKGROUND OF THE INVENTION

Steel cutting tools have been used for centuries in the woodworking industry. One reason for the use of steel cutting tools is the ability to form an optimal cutting edge in steel, so that the cut wood has a relatively high quality finish immediately after the cutting. More recently and in an effort to prolong the useful life of cutting tools used in the woodworking industry, steel cutting tools with tungsten carbide tips and cutting tools formed from metal alloys have been used. Additionally, tungsten insert tooling and polycrystalline diamond fused to tungsten carbide substrates have been used. Nonetheless, completely steel cutting tools are often still a very popular choice in the woodworking industry, due, for example, to cost and quality-of-cut considerations.

Additionally, coatings have been applied to cutting tools used in the woodworking industry in an effort to prolong the useful life of the tools. However, such coated tools have had limited commercial success in the woodworking industry, which is indicative of prior coated tools for the woodworking industry failing to sufficiently satisfy the need for economical cutting tools that are capable of making quality cuts throughout relatively long production runs.

In contrast to the woodworking industry, coated cutting tools have been more widely used in the metalworking industry. Examples of coatings used in the metalworking industry are disclosed in U.S. Pat. Nos. 4,992,153 and 5,707,748, both of which are incorporated herein by reference. However, distinctions that exist between the woodworking industry and the metalworking industry are evidence that these industries are nonanalagous fields of art. For example, metal can be many times harder than wood. Additionally, significant variations can exist in a single piece of wood. For example, these variations can be the result of variation in the density of the wood structure, variation in the moisture content of the wood, variation in the interlock and variability of the grain of the wood, hard mineral deposits within the wood, and variations in tension within the wood. Another vast difference in the woodworking and metalworking industries pertains to the use of liquid lubricants/coolants. More specifically, it is conventional to apply liquid lubricant/coolant to a piece of metal that is being cut, but it is typically unacceptable to apply such liquid lubricant/coolant to a piece of wood being cut, because the wood can absorb some of the liquid lubricant/coolant or otherwise be damaged thereby, which can render the wood unacceptable for many uses.

Needless to say, there is always a demand for improved cutting tools for the woodworking industry, with the ideal cutting tool optimally balancing factors such as cutting tool cost, cutting tool longevity, and cut quality. This demand has not previously been fully satisfied For example and as mentioned above, coated cutting tools have found limited commercial success in the woodworking industry. Additionally, many attempts to find a coating for use on cutting tools in the woodworking industry have failed, due to the resulting coated tools providing little, if any, improvement over similar cutting tools without the coating. Accordingly, there is a need for improved coated cutting tools for use in the woodworking industry.

SUMMARY OF THE INVENTION

In accordance with one aspect of the present invention, problems are solved by providing a coated cutting tool and using the coated cutting tool to cut a plurality of first workpieces, with each first workpiece being wood or including a substantial amount of wood, to produce a plurality of second workpieces from the first workpieces. More specifically regarding this aspect, the coating is preferably applied via a vacuum procedure to at least a portion of the cutting tool that includes the cutting edge, and the coating preferably includes an inner hard layer and an outer friction-reducing layer over the hard layer. The hard layer is harder than the friction-reducing layer and the friction-reducing layer has a lower coefficient of friction than the hard layer. As a result, the performance of the coated cutting tool advantageously exceeds the performance of a like but uncoated cutting tool.

In accordance with another aspect of the present invention, the coated cutting tool is cryogenically treated to advantageously further enhance its performance In accordance with one aspect of the present invention, the cutting tool is steel, and the coating consists essentially of the hard layer lying directly on the cutting tool and the friction-reducing layer lying directly on the hard layer.

In accordance with one aspect of the present invention, the hard layer includes titanium aluminum nitride, and the friction-reducing layer includes tungsten carbide with carbon.

BRIEF DESCRIPTION OF THE DRAWINGS

Figure 1:
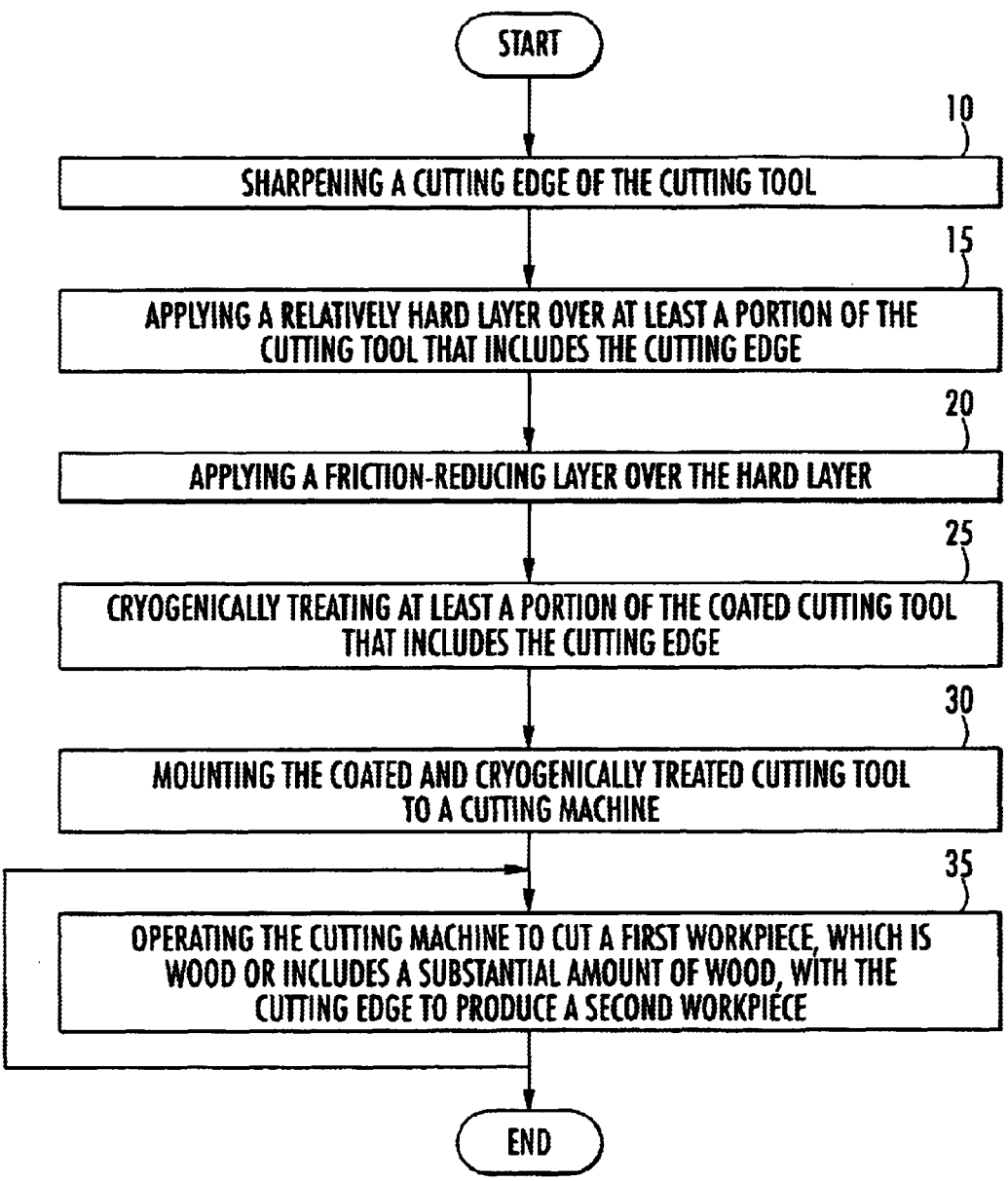
Figure 2:
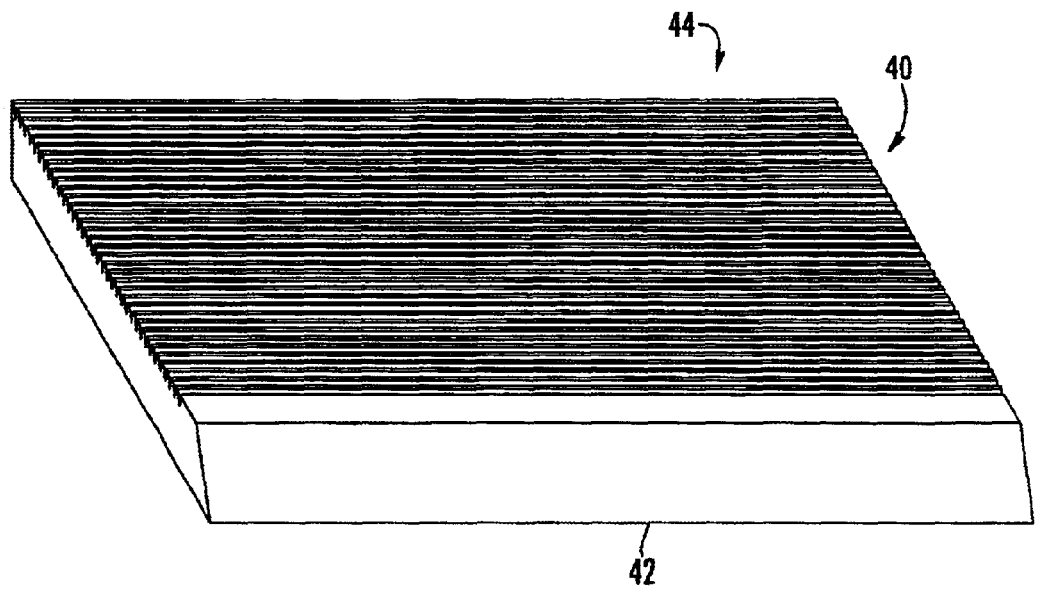
Figure 3:
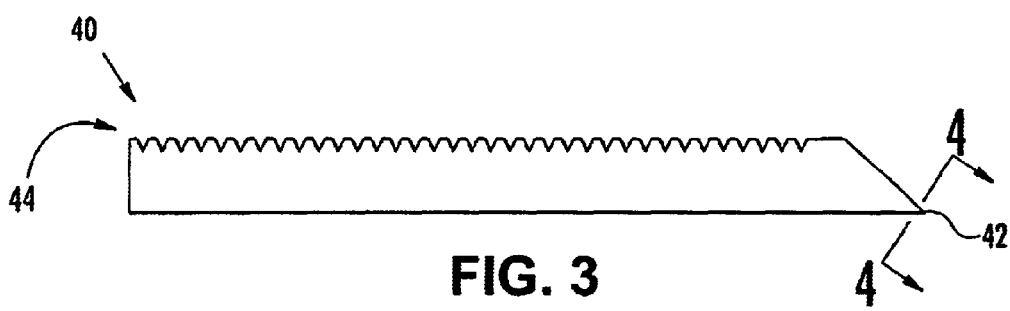

Having thus described the invention in general terms, reference will now be made to the accompanying drawings, which are not necessarily drawn to scale, and wherein:

FIG. 1 is a flow diagram illustrating operations for providing a coated and cryogenically treated cutting tool and using the cutting tool to cut articles containing at least a substantial amount of wood, in accordance with a first embodiment of the present invention;

FIG. 2 is a pictorial view of a cutting tool, namely a coated knife, in accordance with a first example of a second embodiment of the present invention;

FIG. 3 is a left side elevational view of the coated knife of FIG. 2; and

Figure 4:
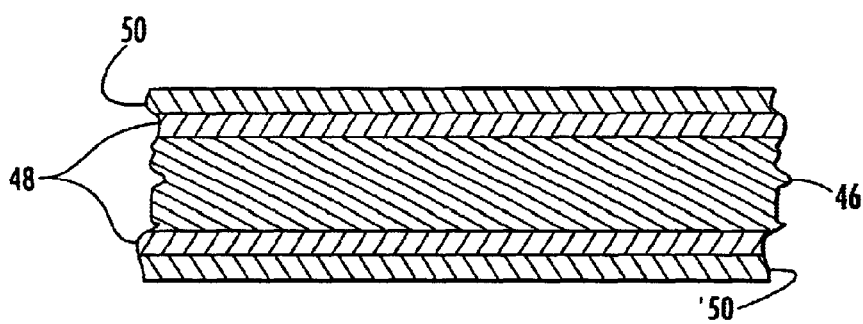

FIG. 4 is a schematic, partial and enlarged cross-section view taken along line 4—4 of FIG. 3.

DETAILED DESCRIPTION OF THE INVENTION

The present invention now will be described more filly hereinafter with reference to the accompanying drawings, in which preferred embodiments of the invention are shown This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

In accordance with one aspect of the present invention, a conventional cutting tool is coated with a predetermined coating and thereafter optionally cryogenically treated, so that the operational characteristics of the cutting tool are advantageously enhanced with respect to its use for cutting a workpiece that is wood or that includes a substantial amount of wood.

First Embodiment

FIG. 1 is a flow diagram illustrating operations for providing a cutting tool and using the cutting tool to cut articles containing at least a substantial amount of wood, in accordance with a first embodiment of the present invention Referring to FIG. 1, a conventional cutting tool is provided and a cutting edge of that tool is formed and/or sharpened at block 10. In accordance with the first embodiment of the present invention, the cutting tool that is the subject of blocks 10–35 of FIG. 1 can be any type of cutting tool used to cut a workpiece that is wood or includes a substantial amount of wood. For example, the cutting tool can acceptably be, but is not limited to, an insert having one or more cutting edges and that it is capable of being rotated in a cutter, a corrugated cutting knife, spiral cutter heads, tongue in groove insert cutters, fingerjoint cutters, ripsaw blades, router bits, drill bits, and the like. As an additional example, the cutting tool can be steel, carbide, or any other material.

A multi-layer coating is applied to the cutting tool, or at least to the cutting edge formed at block 10, at blocks 15 and 20. More specifically, a relatively hard layer is applied over at least a portion of the cutting tool that includes the cutting edge at block 15, and then a friction-reducing layer is applied over the hard layer at block 20. The hard layer applied at block 15 is harder than the friction-reducing layer applied at block 20. The friction-reducing layer applied at block 20 has a lower coefficient of friction than the hard layer applied at block 15.

In accordance with the first embodiment of the present invention, the coating applied at blocks 15 and 20 is preferably applied using vapor deposition processes, most preferably with the hard layer being titanium aluminum nitride and the friction-reducing layer being tungsten carbide with carbon. A suitable vapor deposition process is described in U.S. Pat. Nos. 4,992,153 and 5,707,748, which have been incorporated herein by reference. In accordance with the first embodiment of the present invention, the thickness of the coating is about 2 to 6 micrometers, with the relatively hard inner layer occupying about ⅔ of the thickness and the friction-reducing outer layer occupying about ⅓ of the thickness. After the coating is applied at blocks 15 and 20, the coating has a hardness of about 90 on the Rockwell C Scale, in accordance with the first embodiment of the present invention.

As will be discussed in greater detail below, the coating applied at blocks 15 and 20 advantageously enhances the performance of the cutting tool. When the cutting tool that is being coated is steel, special techniques are advantageously not required for maintaining the coated steel cutting tool. For example, the coated steel cutting tool can advantageously be sharpened with grinding tools that are typically used for steel cutting tools.

In accordance with alternative embodiments of the present invention, the coating applied at blocks 15 and 20 can include any of the combinations of relatively hard and friction-reducing layers disclosed in U.S. Pat. No. 5,707, 748, or the like.

In accordance with the first embodiment of the present invention, the entire coated cutting tool, or at least a portion of the coated cutting tool that includes a cutting edge, is cryogenically treated at block 25. The cryogenic treating that occurs at block 25 further enhances the performance of the cutting tool. More specifically, it is believed that the performance of the coating applied at blocks 15 and 20 as well as the performance of the underlying material of the cutting tool is enhanced by the cryogenic treating performed at block 25.

In accordance with the first embodiment of the present invention and disregarding the item being cryogenically treated, conventional cryogenic techniques are used at step 25. More specifically, at block 25 the temperature of the coated cutting tool is lowered to −300° F., with the lowering of the temperature being spread over a period of about six to ten hours, to avoid thermally shocking the coated cutting tool; then the temperature of the cutting tool is held at approximately −300° F. for about eight to forty hours; and then the temperature of the coated cutting tool is warmed to about 72° F., with the warming being spread over a period of about eight to twenty hours. In accordance with the first embodiment of the present invention, the cryogenic treating that occurs at block 25 advantageously changes both the microstructure of the cutting tool and the microstructure of the coating on the cutting tool.

The coated and cryogenically treated cutting tool is mounted in a conventional manner to a conventional cutting machine at block 30. Thereafter at block 35, the combination formed at block 30 is used to cut first workpieces with the cutting edge of the coated and cryogenically treated cutting tool, to produce second workpieces. In accordance with the first embodiment of the present invention, the first workpieces are boards, or the like, that are solid pieces of wood; or boards, or the like, containing a substantial amount of wood, such as medium density fiberboard (MDF) and particle board, both of which include multiple pieces of wood that are glued together. Preferably the cutting operations of block 35 are repeated in close succession for the same cutting machine and cutting tool, so that multiple second workpieces are quickly produced from first workpieces by cutting the first workpieces serially and in rapid succession.

During the cutting operations at block 35, the coating on the cutting tool reflects heat generated due to various factors of the woodworking process, so that heat is reflected away from the cutting tool and therefore does not damage the cutting tool. Reflecting the heat advantageously dramatically slows the process of dulling the cutting edge of the cutting tool. Additionally, the friction-reducing layer of the coating on the cutting tool has a much lower coefficient of friction than steel. For example, the friction-reducing layer feels about four times slicker than steel alone. This allows the wood chips, or the like, being generated during the cutting at block 35 to flow away from the cutting tool faster and more efficiently with the coating than without. This not only reduces the heat buildup on the cutting tool, but also advantageously reduces the number of chips that are forced back down onto the area of the workpiece that is being cut. The accumulation of chips at the area of the workpiece being cut inhibits the cutting.

Second Embodiment

A second embodiment of the present invention is identical to the first embodiment of the present invention, except that the cryogenic treating at block 25 of FIG. 1 is omitted, so that a coated cutting tool is mounted to a cutting machine at block 30 and thereafter the combination formed at block 30 is used for cutting at block 35.

In accordance with an initial example of the second embodiment of the present invention, coated steel knives cutting MDF at block 35 have yielded a tool life that was more than half the life of uncoated tungsten carbide knives, making steel knives that are coated with the coating of the present invention a cost effective alternative to more expensive tungsten carbide knives. In many applications, coating a steel cutting tool with the coating of the present invention increases the life of the tool by at least about 50% and allows for optimization of feed rates.

First Example of Second Embodiment

In accordance with a first example of the second embodiment of the present invention, the coated cutting tool is a coated knife, namely a coated corrugated steel knife 40 that is illustrated in FIGS. 2–4. The coated corrugated steel knife 40 includes a cutting edge 42 and a series of features on the top of the knife that can be referred to as corrugations 44. The corrugations 44 include an alternating series of ridges and grooves extending between opposite sides of the knife 40. In the enlarged and partial cross-sectional view of FIG. 4, the coating on the steel base material 46 of the knife 40 is schematically shown. More specifically, the relatively hard layer 48 of the coating is directly on the base material 46, and the friction-reducing layer 50 is directly on the relatively hard layer.

A first operational example and a first comparative example are partially presented in the following Table I to provide a comparison that is illustrative of advantageous aspects of the present invention. The first operational example quantifies the performance of knives 40 of the first example of the second embodiment of the present invention, and the first comparative example quantifies the performance of conventional knives that are like the knives 40 of the first operational example, except that the knives of the first comparative example were uncoated

TABLE I

| Example | Condition Of Knives At End Of Run | Finish Quality Of Second Workpieces At End Of Run |
| --- | --- | --- |
| First Operational Example | Slightly dull but still good for more production. | Second workpieces were very clean and required minimal sanding. |
| First Comparative Example | Completely dull. | Second workpieces were beginning to show signs of negative clearance angle, and they required massive sanding. |

As indicated by Table I, the knives 40 used for the first operational example advantageously outperformed the conventional knives used for the first comparative example. For both the first operational example and the first comparative example that are the subject of Table I, the first workpieces, from which the second pieces were cut, were pieces of wood, namely cottonwood, oak, hickory, cherry and maple; the first workpieces were fed into a moulder machine at about 120 feet per minute; the moulder machine was equipped with hydrolock cutter heads, each carrying three of the respective knives. For the first operational example, jointing of the knives was advantageously required only two to no more than three times per run. In contrast, for the first comparative example, jointing of the knives was required from six to eight times during each run. Those of ordinary skill in the art know about jointing the knives mounted to a moulding machine, namely that for each rotating cutter head a jointing block is placed proximate thereto to uniformly form the cutting edges of the knives carried by the cutter head. Those of ordinary skill in the art know that it is preferred to minimize the number of required jointing operations.

Those of ordinary skill in the art know that a conventional moulder machine includes multiple spindles, each of which is for carrying a cutter head to which two or more knives are mounted. A conventional moulder machine is capable of contemporaneously machining all four sides of a workpiece that is passing through the moulder machine. Accordingly, moulder machines are capable of machining complex shapes, such as, but not limited to, picture frames, window casings, or crown mouldings in a single pass. Modern moulder machines have a series of drive rollers that move the workpiece through the moulder machine.

Second Example of Second Embodiment

A second example of the second embodiment is identical to the first example of the second embodiment, except that the coating, namely the relatively hard and friction-reducing layers 48 and 50 of FIG. 4, are applied to inserts for cutting, namely solid carbide inserts.

A second operational example and a second comparative example are partially presented in the following Table II to provide a comparison that is illustrative of advantageous aspects of the present invention. The second operational example quantifies the performance of coated inserts (i.e., bits) of the second example of the second embodiment of the present invention, and the first comparative example quantifies the performance of conventional inserts that are like the inserts of the second operational example, except that the inserts of the second comparative example are

TABLE II

| Example | Run Time | Condition Of Inserts At End Of Run |
| --- | --- | --- |
| Second Operational Example | 85–100 hours. | Worn on cutting edge. |
| Second Comparative Example | 30–40 hours. | Worn out. |

As indicated by Table II, the coated inserts used for the second operational example advantageously outperformed the uncoated inserts used for the second comparative example For both the second operational example and the second comparative example that are the subject of Table II above, the first workpieces were the same wood species; the second workpieces were cabinet parts; the inserts were run on a variety of machines from moulders to shapers and custom machines; and at the end of each run the finish where the second workpieces had been cut was poor. As indicated by Table II, the coated inserts for the second operational example were advantageously capable of performing much longer than the uncoated inserts for the second comparative example.

Exemplary coated cutting tools of a third embodiment of the present invention are identical to the exemplary coated cutting tools of the second embodiment of the present invention, except that each of the operations of blocks 10–35 of FIG. 1 are performed in accordance with the third embodiment of the present invention. That is, the exemplary coated cutting tools of the third embodiment of the present invention are cryogenically treated at block 25.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A method for providing and using a cutting tool to cut a plurality of first workpieces, with each first workpiece being wood or including a substantial amount of wood, to produce a plurality of second workpieces from the first workpieces, the method comprising:

applying via a vacuum procedure a coating to at least a portion of the cutting tool that includes a cutting wedge of the cutting tool, the coating including in hard layer a an outer friction-reducing layer over the hard layer, whereby a coated cutting tool is formed, and wherein the hard layer is harder than the friction-reducing layer and the friction-reducing layer has a lower coefficient of fiction than the hard layer; and then cutting the first workpieces, which are wood or include a substantial amount of wood, with the cutting edge of the coated cutting tool to produce the second workpieces, wherein the applying the coating includes:

adhering the hard layer to the cutting tool, with the adhering the hard layer to the cutting tool including adhering titanium aluminum nitride to the cutting tool, and adhering the friction-reducing layer over the hard layer, with the adhering the friction-reducing layer including adhering tungsten carbide with carbon over the hard layer.

2. The method of claim 1, wherein the coating consists essentially of the hard layer lying directly on the cutting tool and the friction-reducing layer lying directly on the hard layer.

3. The method of claim 1, further comprising cryogenically treating at least a portion of the coated cutting tool that includes the cutting edge, wherein the cryogenically treating is performed prior to the cutting.

4. The method of claim 1, wherein the cutting the first workpieces with the cutting edge of the coated cutting tool to produce the second workpieces includes cutting the fist workpieces serially.

5. The method of claim 4, further comprising cryogenically treating at least a portion of the coated cutting tool that includes the cutting edge, wherein the cryogenically treating id preformed prior to the cutting.

6. The method of claim 1, wherein at least the cutting edge of the cutting tool is steel, so that the coating includes coating the steel cutting edge.

7. The method of claim 6, further comprising cryogenically treating at least a portion of coated cutting tool that includes the cutting edge, wherein the cryogenically treating is performed prior to the cutting.

8. The method of claim 1, further comprising sharpening the cutting edge of the cutting tool prior to applying the coating to the cutting tool.

9. The method of claim 8, further comprising cryogenically treating at least a portion of the coated cutting tool that includes the cutting edge, wherein the cryogenically treating is performed prior to the cutting.

10. A method for providing and using a cutting tool to cut a plurality of first workpieces, with each first workpiece being wood or including a substantial amount of wood, to produce a plurality of second workpieces from the first workpieces, the method comprising:

providing a cutting tool having a cutting edge;

then applying via a vacuum procedure a hard coating to a least a portion of the cutting tool that includes the cutting edge;

then applying via a vacuum procedure a friction-reducing coating over the hard coating, whereby a coated cutting tool is formed, and wherein the hard coating is harder than the friction-reducing coating and the friction-reducing coating has a lower coefficient of friction than the hard coating; and then cutting the first workpieces, which are wood or include a substantial amount of wood, with cutting edge of the coated cutting tool to produce the second workpieces, wherein;

the applying via the vacuum procedure the hard coating includes adhering titanium aluminum nitride to the cutting tool, and the applying via the vacuum procedure the friction-reducing coating over the hard coating includes adhering tungsten carbide with carbon over the hard coating.

11. The method of claim 10, wherein:

the applying via the vacuum procedure the hard coating includes applying the hard coating directly on the cutting tool; and the applying via the vacuum procedure the friction-reducing coating over the hard coating includes applying the friction-reducing coating directly on the hard coating.

12. The method of claim 10, wherein at least the cutting edge of the cutting tool is steel.

13. The method of claim 10, further comprising a cryogenically treating at least a portion of the coated cutting tool that includes the cutting edge, wherein the cryogenically treating is performed prior to the cutting.

14. The method of claim 10, further comprising sharpening the cutting edge of the cutting tool prior to applying the coatings to the cutting tool.

15. The method of claim 10, wherein:

the adhering titanium aluminium nitride to the cutting tool includes applying the titanium aluminum nitride directly on the cutting tool; and the adhering tungsten carbide with carbon over the hard coating includes applying the tungsten carbide with carbide directly on the titanium aluminum nitride.

16. The method of claim 15, wherein at least the cutting edge of the tool is steel.

17. A method for providing and using a cutting tool to cut a plurality of first workpieces, with each first workpiece being wood or including a substantial amount of wood, to produce a plurality of second workpieces from the first workpieces, the method comprising:

providing a cutting tool having a cutting edge;

then applying a coating of titanium aluminum nitride to at least a portion of the cutting tool that includes the cutting edge;

then applying a coating of titanium carbide with carbon over the titanium aluminum nitride, whereby a coated cutting tool is formed, and wherein the coating of titanium aluminum nitride is harder than the coating of tungsten carbide with carbon and the coating of tungsten carbide with carbon has a lower coefficient of friction than the coating of titanium aluminum nitride; and then cutting the first workpieces, which are wood or include a substantial amount of wood, with the cutting edge of the coated cutting tool to produce the second workpieces.

18. The method of claim 17, wherein:

the applying the coating of titanium aluminum nitride includes applying the coating of titanium aluminum nitride directly on the cutting tool; and the applying the coating of tungsten carbide with carbon over the titanium aluminum nitride include applying coating of tungsten carbide with carbon directly over the coating of titanium aluminum nitride.

19. The method of claim 17, wherein at least the cutting edge of the cutting tool is steel.

20. The method of claim 17, further comprising sharpening the cutting edge of the cutting tool prior to applying the coatings to the cutting tool.

* * * * *

UNITED STATES PATENT AND TRADEMARK OFFICE
CERTIFICATE OF CORRECTION

PATENT NO.    : 6,716,483 B1
DATED         : April 6, 2004
INVENTOR(S)   : Rankin, Sr.

It is certified that error appears in the above-identified patent and that said Letters Patent is hereby corrected as shown below:

Column 6,
Line 22, after "example are" insert -- uncoated. --.

Signed and Sealed this

Thirtieth Day of November, 2004

JON W. DUDAS
*Director of the United States Patent and Trademark Office*